United States Patent
Dong et al.

(10) Patent No.: US 10,504,768 B1
(45) Date of Patent: Dec. 10, 2019

(54) CONTACT STRUCTURES TO DEEP TRENCH ISOLATION STRUCTURES AND METHOD OF NANUFACTURING THE SAME

(71) Applicant: GLOBALFOUNDRIES Singapore Pte. Ltd., Singapore (SG)

(72) Inventors: Ke Dong, Singapore (SG); Purakh R. Verma, Singapore (SG); Shiang Yang Ong, Singapore (SG); Namchil Mun, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/021,893

(22) Filed: Jun. 28, 2018

(51) Int. Cl.
| | |
|---|---|
| H01L 21/70 | (2006.01) |
| H01L 21/74 | (2006.01) |
| H01L 21/762 | (2006.01) |
| H01L 23/535 | (2006.01) |
| H01L 21/768 | (2006.01) |

(52) U.S. Cl.
CPC ...... *H01L 21/743* (2013.01); *H01L 21/76202* (2013.01); *H01L 21/76224* (2013.01); *H01L 21/76802* (2013.01); *H01L 23/535* (2013.01)

(58) Field of Classification Search
CPC .............. H01L 21/76; H01L 21/76202; H01L 21/76224; H01L 21/76802
See application file for complete search history.

(56) References Cited

U.S. PATENT DOCUMENTS

| | | | | |
|---|---|---|---|---|
| 7,679,130 B2* | 3/2010 | Tilke | ............... | H01L 27/105 257/316 |
| 7,691,734 B2* | 4/2010 | Orner | ............... | H01L 21/763 257/216 |
| 2008/0197446 A1* | 8/2008 | Disney | ............... | H01L 21/761 257/506 |
| 2009/0140330 A1* | 6/2009 | Yagi | ............... | H01L 21/76202 257/330 |
| 2010/0096721 A1* | 4/2010 | Tanaka | ............... | H01L 21/76202 257/509 |

OTHER PUBLICATIONS

Application and Drawings for U.S. Appl. No. 15/726,405, filed Oct. 6, 2017, 33 pages.

* cited by examiner

*Primary Examiner* — Phuc T Dang
(74) *Attorney, Agent, or Firm* — David Cain; Andrew M. Calderon; Roberts Mlotkowski Safran Cole & Calderon, P.C.

(57) ABSTRACT

The present disclosure relates to semiconductor structures and, more particularly, to contact structures to deep trench isolation structures and methods of manufacture. The structure includes: a deep trench structure lined with insulator material on sidewalls thereof; conductive material filling the deep trench structure; a local oxide extending above the trench on exposed portions of the insulator material; an interlevel dielectric material on the local oxide and the conductive material filling the deep trench structure; and a contact in the interlevel dielectric material, extending to the conductive material and on a side of the local oxide.

20 Claims, 3 Drawing Sheets

CONTACT STRUCTURES TO DEEP TRENCH ISOLATION STRUCTURES AND METHOD OF NANUFACTURING THE SAME

FIELD OF THE INVENTION

The present disclosure relates to semiconductor structures and, more particularly, to contact structures to deep trench isolation structures and methods of manufacture.

BACKGROUND

LOCal Oxidation of Silicon (LOCOS) is a microfabrication process where silicon dioxide is formed in selected areas on a silicon wafer having an Si—SiO$_2$ interface. The current process of record for a contact structure of a LOCOS deep trench isolation (DTI) requires an etching process through the LOCOS oxide. This etching process cannot be achieved without an additional mask to define the contact etch through the LOCOS oxide on a doped poly of DTI. This is a costly process and adds to the manufacturing complexity.

SUMMARY

In an aspect of the disclosure, a structure comprises: a deep trench structure lined with insulator material on sidewalls thereof; conductive material filling the deep trench structure; a local oxide extending above the trench on exposed portions of the insulator material; an interlevel dielectric material on the local oxide and the conductive material filling the deep trench structure; and a contact in the interlevel dielectric material, extending to the conductive material and on a side of the local oxide.

In an aspect of the disclosure, a method comprises: forming a deep trench structure lined with insulator material; forming conductive material filling the deep trench structure; forming a local oxide extending above the deep trench structure on exposed portions of the insulator material; forming an interlevel dielectric material on the local oxide and the conductive material filling the deep trench structure; and forming a contact in the interlevel dielectric material, extending to the conductive material and on a side of the local oxide.

In an aspect of the disclosure, a method comprises: forming a deep trench structure in a semiconductor material; lining sidewalls of the semiconductor material with oxide material; filling in remaining portions of the deep trench isolation structure with doped poly material; exposing the oxide material on the sidewalls of the deep trench structure; performing a local oxidation process on the oxide material to form a local oxide on the oxide material, while blocking portions of the doped poly material; covering the local oxide and the doped poly material with an interlevel dielectric material; and forming a contact to the doped poly material through the interlevel dielectric material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to contact structures to deep trench isolation structures and methods of manufacture. More specifically, the present disclosure provides a contact structure which directly touches poly material of a LOCOS (LOCal Oxidation of Silicon) deep trench isolation (DTI) structure (e.g., deep trench isolation with LOCOS oxidation). Advantageously, the present disclosure avoids using additional masks to define the DTI contact, hence reducing manufacturing costs, time and complexity.

The contact structures of the present disclosure can be manufactured in a number of ways using a number of different tools. In general, though, the methodologies and tools are used to form structures with dimensions in the micrometer and nanometer scale. The methodologies, i.e., technologies, employed to manufacture the contact structures of the present disclosure have been adopted from integrated circuit (IC) technology. For example, the structures are built on wafers and are realized in films of material patterned by photolithographic processes on the top of a wafer. In particular, the fabrication of the contact structures uses three basic building blocks: (i) deposition of thin films of material on a substrate, (ii) applying a patterned mask on top of the films by photolithographic imaging, and (iii) etching the films selectively to the mask.

Figure 1:
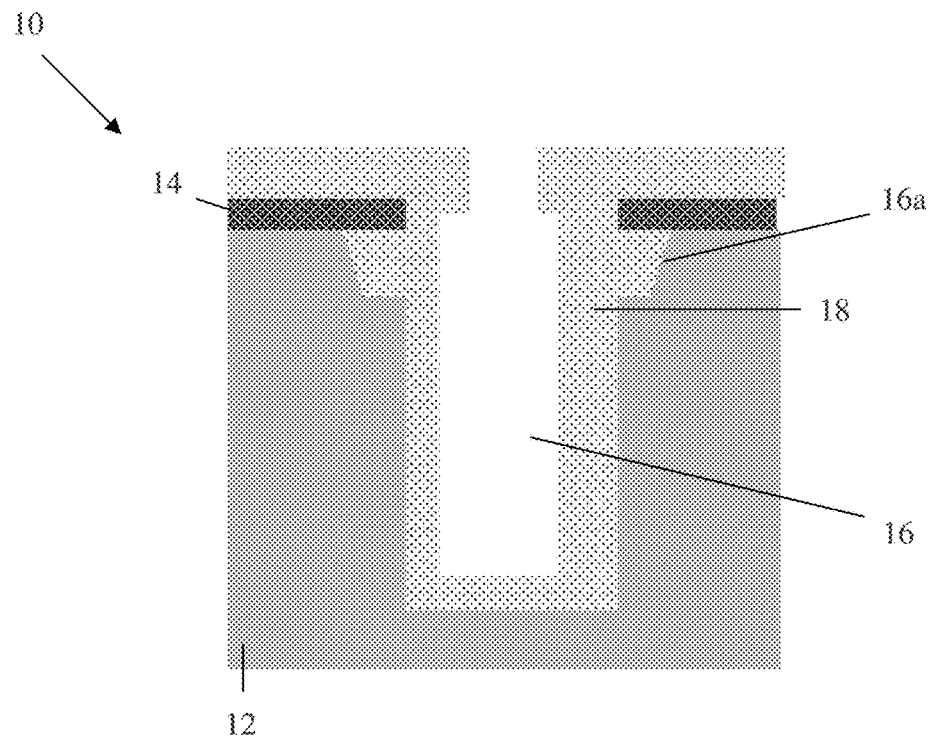
FIG. 1 shows a lined deep trench structure, amongst other features, and respective fabrication processes in accordance with aspects of the present disclosure.

FIG. 1 shows a lined deep trench structure, amongst other features, and respective fabrication processes in accordance with aspects of the present disclosure. The structure 10 of FIG. 1 includes a semiconductor substrate 12. In embodiments, the semiconductor substrate 12 can be any suitable semiconductor material including, but not limited to, Si, SiGe, SiGeC, SiC, GaAs, InAs, InP, and other III/V or II/VI compound semiconductors. A masking material 14 is formed over the semiconductor substrate 12. In embodiments, the masking material 14 can be SiN, for example, formed by a conventional deposition process, e.g., chemical vapor deposition (CVD) processes.

Still referring to FIG. 1, a deep trench structure 16 is formed in the semiconductor substrate 12 and through the masking material 14. The trench depth can be between 20 μm and 50 μm, with an opening of about 2.0 μm; although other dimensions are also contemplated herein. The deep trench structure 18 can be formed by conventional lithography and etching methods known to those of skill in the art. For example, a resist formed over the masking material 14 is exposed to energy (light) to form a pattern (opening). An etching process with a selective chemistry, e.g., reactive ion etching (RIE), will be used to form the deep trench structure 16 in the semiconductor material 12 through the openings of the resist. In embodiments, the etching process can form an undercut 16a under the masking material 14. The resist can then be removed by a conventional oxygen ashing process or other known striplants.

Following the resist removal, an insulator material 18 is formed in the deep trench structure 16 and over the masking material 14. In embodiments, the insulator material 18 will line the sidewalls and the bottom of the deep trench structure 16. The insulator material 18 can be, e.g., a tetraethoxysilane (TEOS). Accordingly, as shown representatively in FIG. 1, the insulator material 18 will coat the entire surface of the masking material 14 and the deep trench structure 16. In embodiments, the insulator material 18 can have a thickness of about 0.2 µm to 1.0 µm; although other dimensions are contemplated herein. For example, the thickness of the insulator material 18 can be any thickness that does not completely fill the deep trench structure 16 (thereby allowing doped poly to be deposited within the deep trench structure 16 in subsequent fabrication processes).

Figure 2:
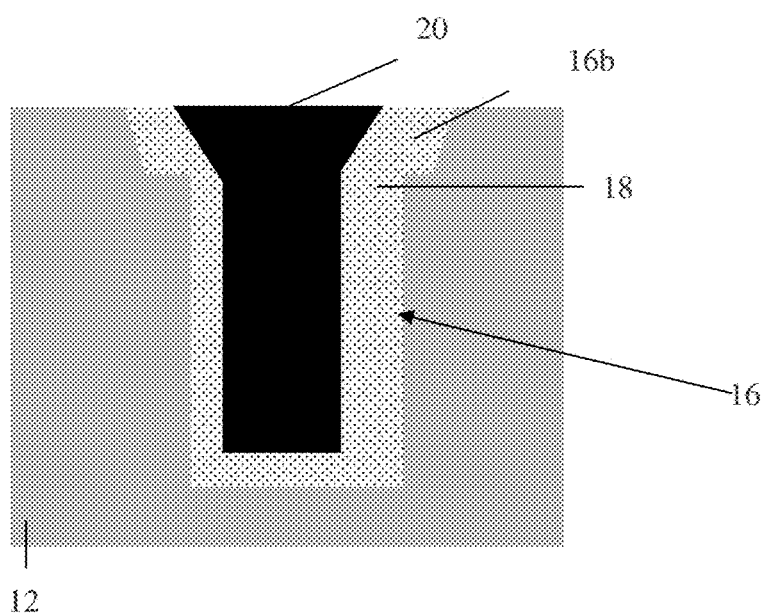
FIG. 2 shows doped poly material in the lined deep trench structure, amongst other features, and respective fabrication processes in accordance with aspects of the present disclosure.

In FIG. 2, the insulator material 18 is subjected to an anisotropic etching process that removes the insulator material 18 from all horizontal surfaces. For example, the insulator material 18 is removed from the masking material 14 and a bottom surface of the deep trench structure 16. In addition, the etching process can widen the opening 16b of the deep trench structure 16. Following the etch process, a conductive material 20, e.g., doped poly material, can be deposited within the deep trench structure 16, directly on the TEOS material. In embodiments, the doped poly material 20 can be, e.g., P+ doped material which is in-situ doped. Any residual doped poly material 20 and masking material 14 on the surface of the structure can be removed by a chemical mechanical planarization (CMP) process, as one example.

Figure 3:
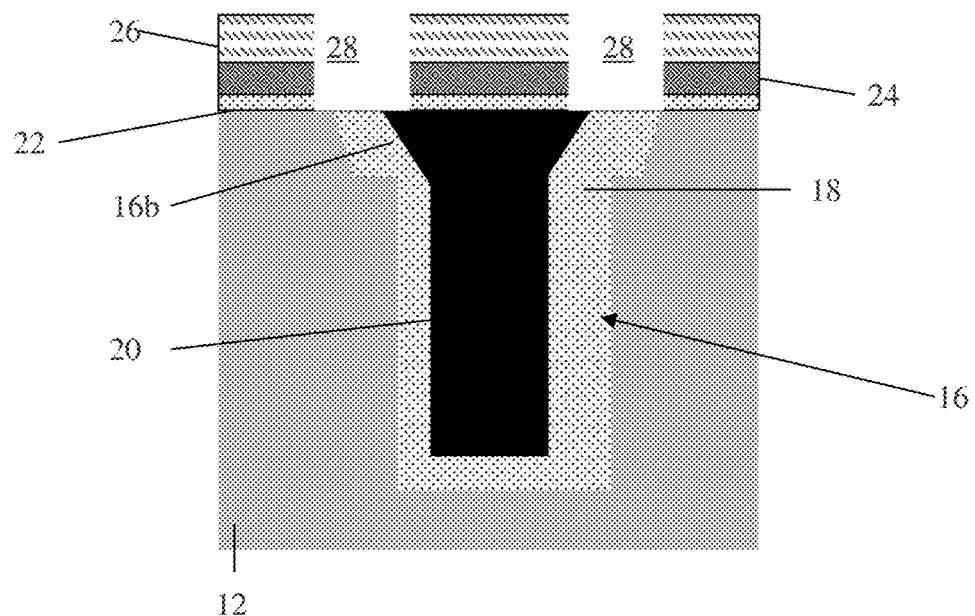
FIG. 3 shows a patterned pad oxide material and pad nitride material, amongst other features, and respective fabrication processes in accordance with aspects of the present disclosure.

As shown in FIG. 3, a pad oxide 22 and a pad nitride 24 are sequentially deposited on the planarized surface of FIG. 2, e.g., over the deep trench structure 16 which is now filled with the insulator material 18 and doped poly material 20. In embodiments, the pad oxide 22 and pad nitride 24 can be deposited by a conventional deposition method, e.g., CVD or plasma enhanced deposition (PEVD). The thickness of the pad oxide 22 and pad nitride 24 can be about 1 µm to 2.5 µm; although other dimensions are also contemplated herein.

A resist 26 is formed over the pad nitride 24. The resist 26 is exposed to energy (light) to form a pattern (opening). An etching process with a selective chemistry, e.g., RIE, to form openings 28 in the pad oxide 22 and pad nitride 24. In embodiments, the etching process will expose the insulator material 18 through the openings 28, while still allowing the pad oxide 22 and pad nitride 24 to protect portions of the doped poly material 20 within the deep trench structure 16.

Figure 4:
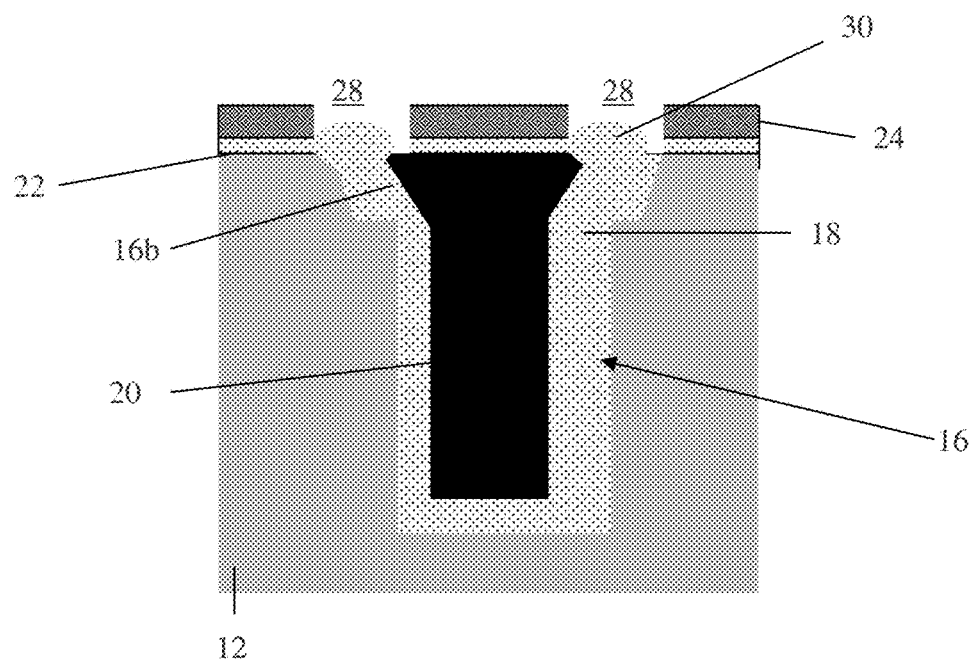
FIG. 4 shows LOCOS oxide in openings of the patterned pad oxide material and pad nitride material, adjacent (but not over) to the doped poly material, amongst other features, and respective fabrication processes in accordance with aspects of the present disclosure.

In FIG. 4, after the etching process the resist can be removed by a conventional oxygen ashing process or other known striplants. The exposed insulator material 18 will then be subjected to a LOCOS oxidation process to form a LOCOS oxide 30 in the openings 28, extending from the exposed liner material 18 (e.g., TEOS). Advantageously, the LOCOS oxide 30 will not cover the doped poly material 20 due to the placement of the patterned pad oxide 22 and pad nitride 24 which protects this region during the LOCOS oxidation process. Instead, the LOCOS oxide 30 is formed on a side (about) of the doped poly material 20. For the thickness of LOCOS, it could be the range from 1500 Å to 5000 Å; although other dimensions are contemplated herein.

Figure 5:
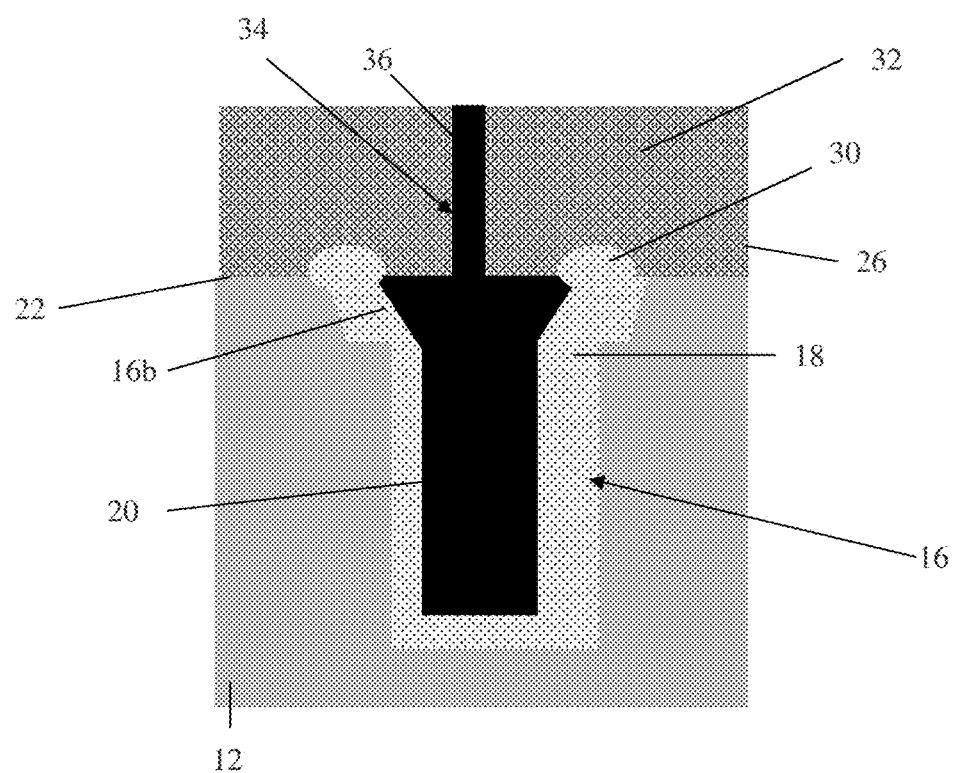
FIG. 5 shows a contact to the doped poly material, amongst other features, and respective fabrication processes in accordance with aspects of the present disclosure.

As further shown in FIG. 5, the pad nitride 24 is removed followed by the deposition of an insulator material 32, e.g., oxide material or other interlevel dielectric material. The insulator material 32 can be deposited by a conventional CVD process. In embodiments, the insulator material 32 will cover the LOCOS oxide 28 and the doped poly material 20. A via 34 is formed in insulator material 32 adjacent (e.g., on a side) to the LOCOS oxide 28 and which extends to the doped poly material 20 in the deep trench structure 16. The via 34 is formed by conventional lithography and etching processes as already described herein. A metal material 36 is then deposited in the via 34 to form a contact to the doped poly material 20.

Advantageously, due to the placement of the LOCOS oxide 30 on the side of the doped poly material 20, there is now no need to etch through the LOCOS oxide 30 to reach the doped poly material 20 for contact formation. Accordingly, there is no need for an additional mask to define the contact etch through the LOCOS oxide 30 on the doped poly material 20 of the deep trench isolation structure 16.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    a deep trench structure lined with insulator material on sidewalls thereof;
    conductive material filling the deep trench structure;
    a local oxide extending above the deep trench and directly on only exposed portions of the insulator material;
    an interlevel dielectric material directly on the local oxide and the conductive material filling the deep trench structure; and
    a contact in the interlevel dielectric material, extending to and directly contacting the conductive material and on a side of the local oxide.

2. The structure of claim 1, wherein the conductive material is poly material.

3. The structure of claim 2, wherein the poly material is doped poly material.

4. The structure of claim 2, wherein the insulator material is oxide.

5. The structure of claim 4, wherein the local oxide is on sides of the poly material which is within the deep trench structure.

6. The structure of claim 5, wherein the local oxide is LOCOS oxide extending above a surface of the exposed insulator material on sidewalls of the deep trench structure.

7. A method comprises:
forming a deep trench structure lined with insulator material;
forming conductive material filling the deep trench structure;
forming a local oxide extending above the deep trench structure on exposed portions of the insulator material;
forming an interlevel dielectric material on the local oxide and the conductive material filling the deep trench structure; and
forming a contact in the interlevel dielectric material, extending to the conductive material and on a side of the local oxide,
wherein the forming of the local oxide material comprises:
forming at least one pad layer over the deep trench structure;
forming an opening in the at least one pad layer to expose the insulator material which is lining the deep trench structure; and
performing a local oxidation process on the exposed insulator material.

8. The method of claim 7, wherein the deep trench structure is formed by an etching process into a semiconductor material.

9. The method of claim 7, wherein the conductive material filling the deep trench structure comprises an in-situ doped material.

10. The method of claim 9, wherein the in-situ doped material is doped poly material.

11. The method of claim 7, wherein the at least one pad layer is an oxide layer and a nitride layer.

12. The method of claim 7, wherein the forming of the opening includes masking portions of the doped poly material so that oxide does not form on the masked portions of the doped poly material.

13. The method of claim 7, wherein the contact is formed adjacent to the local oxide and in direct contact with the doped poly material.

14. A method comprising:
forming a deep trench structure in a semiconductor material;
lining sidewalls of the semiconductor material with oxide material;
filling in remaining portions of the deep trench isolation structure with doped poly material;
exposing the oxide material on the sidewalls of the deep trench structure; and
performing a local oxidation process on the oxide material to form a local oxide on the oxide material, while blocking portions of the doped poly material.

15. The method of claim 14, further comprising:
covering the local oxide and the doped poly material with an interlevel dielectric material; and
forming a contact to the doped poly material through the interlevel dielectric material.

16. The method of claim 15, wherein the contact is formed on a side of the local oxide.

17. The method of claim 16, wherein the forming of the local oxide comprises:
forming at least one pad layer over the deep trench structure;
forming an opening in the at least one pad layer to expose the oxide material lining the deep trench structure; and
performing a local oxidation process on the exposed insulator material.

18. The method of claim 17, wherein the performing of the local oxidation process includes blocking portions of the doped poly material with the at least one pad layer.

19. The method of claim 18, wherein the at least one pad layer is an oxide pad layer and a nitride pad layer.

20. The method of claim 19, wherein the oxide pad layer is patterned and a portion of the patterned oxide pad layer prevents oxidation from occurring over the doped poly material.

* * * * *